(12) United States Patent
Hsu (10) Patent No.: US 10,796,639 B1
(45) Date of Patent: Oct. 6, 2020

(54) DISPLAY DEVICE AND METHOD FOR CALIBRATING THE SAME

(71) Applicant: INT TECH CO., LTD., Hsinchu County (TW)

(72) Inventor: Kuo-Cheng Hsu, Taichung (TW)

(73) Assignee: INT TECH CO., LTD., Hsinchu County (TW)

( * ) Notice: Subject to any disclaimer, the term of this patent is extended or adjusted under 35 U.S.C. 154(b) by 0 days.

(21) Appl. No.: 16/586,754

(22) Filed: Sep. 27, 2019

(51) Int. Cl.
| | |
|---|---|
| *H05B 37/02* | (2006.01) |
| *G09G 3/3233* | (2016.01) |
| *H01L 27/146* | (2006.01) |
| *G09G 3/3258* | (2016.01) |
| *H01L 27/32* | (2006.01) |
| *H05B 45/00* | (2020.01) |
| *G06K 9/00* | (2006.01) |

(52) U.S. Cl.
CPC ......... *G09G 3/3233* (2013.01); *G09G 3/3258* (2013.01); *H01L 27/14625* (2013.01); *H01L 27/14627* (2013.01); *H01L 27/3227* (2013.01); *H05B 45/60* (2020.01); *G06K 9/0004* (2013.01); *G09G 2320/0233* (2013.01); *G09G 2320/046* (2013.01); *G09G 2320/0673* (2013.01); *G09G 2320/0693* (2013.01); *G09G 2330/10* (2013.01); *G09G 2360/141* (2013.01); *G09G 2360/145* (2013.01); *H01L 27/14678* (2013.01); *H01L 27/3246* (2013.01)

(58) Field of Classification Search
CPC ............ H05B 37/0227; H05B 37/0254; H05B 37/0272; H01L 27/288; H01L 27/3269
USPC .................................................. 315/152, 158
See application file for complete search history.

(56) References Cited

U.S. PATENT DOCUMENTS

| | | | | |
|---|---|---|---|---|
| 8,477,125 | B2 * | 7/2013 | Park ....................... | H01L 27/144 250/206 |
| 2006/0238135 | A1 * | 10/2006 | Kimura .................... | G09G 3/20 315/169.3 |
| 2007/0273292 | A1 * | 11/2007 | Choi ..................... | H01L 27/1446 315/158 |
| 2007/0285411 | A1 * | 12/2007 | Yang .................... | H01L 27/3269 345/207 |
| 2011/0148835 | A1 * | 6/2011 | Yamazaki ............ | G09G 3/3413 345/207 |
| 2018/0032778 | A1 * | 2/2018 | Lang .................... | G06K 9/0002 |
| 2019/0293981 | A1 * | 9/2019 | Liao ................... | G02F 1/134336 |

* cited by examiner

*Primary Examiner* — Tung X Le
(74) *Attorney, Agent, or Firm* — WPAT, P.C., Intellectual Property Attorneys; Anthony King (57) ABSTRACT

A display device includes a light emitting device, a photo sensing layer, a first electronic component and a second electronic component. The light emitting device emits light. The light emitting device has a plurality of light emitting units. The photo sensing layer receives the light and generates a first signal according to the received light. The first signal corresponds to a parameter of the light emitting units. The first electronic component controls the light emitting units. The second electronic component compares the first signal with data corresponding to a predetermined parameter of the light emitting units and identities which light emitting unit has a different parameter with respect to the predetermined parameter.

17 Claims, 6 Drawing Sheets

DISPLAY DEVICE AND METHOD FOR CALIBRATING THE SAME

BACKGROUND

1. Technical Field

The present disclosure is related to a display device and a method for calibrating the display device, especially to an organic light emitting display device.

2. Description of the Related Art

Organic light emitting display (OLED) has been used widely in most high end electron devices, especially the Active Matrix type OLED (AMOLED). Each light-emitting element, i.e. pixel, in the AMOLED is independently controlled by Thin Film Transistor (TFT). The pixels require power supply signal line to load direct current output voltage (VDD) for driving. However, since the driving current for all the pixels are provided by the VDD, undesired resistance may exist, and causing power supply voltage drop (IR drop). The IR drop may cause current difference among different areas, resulting in the uneven brightness (i.e., mura) phenomenon.

In addition, the AMOLED generates light by passing current through organic material films. As time elapsed, the organic materials may become aged, meanwhile, the light emitting efficiency may reduce. Furthermore, the burn-in issue is also one of the major problems for the AMOLED. Therefore, the OLED industry is seeking routes to address the above issues.

SUMMARY

In accordance with an aspect of the present disclosure, a display device includes a light emitting device, a photo sensing layer, a first electronic component and a second electronic component. The light emitting device emits light. The light emitting device has a plurality of light emitting units. The photo sensing layer receives the light and generates a first signal according to the received light. The first signal corresponds to a parameter of the light emitting units. The first electronic component controls the light emitting units. The second electronic component compares the first signal with data corresponding to a predetermined parameter of the light emitting units and identifies which light emitting unit has a different parameter with respect to the predetermined parameter.

In accordance another aspect of the present disclosure, a method for calibrating a display device, comprises (a) emitting a light by a plurality of light emitting units; (b) receiving the light by a photo sensor; (c) comparing a parameter of the light received by the photo sensor with a predetermined parameter; (d) determining a light emitting unit as an abnormal light emitting unit if the parameter of the light emitting unit is different from the predetermined parameter; and (e) generating a calibration signal to adjust the parameter of the abnormal light emitting unit. The light from the light emitting units is emitted toward the photo sensor, or the light from the light emitting units is emitted toward an object covering the light emitting units and reflected to the photo sensor.

Common reference numerals are used throughout the drawings and the detailed description to indicate the same or similar components. The present disclosure can be best understood from the following detailed description taken in conjunction with the accompanying drawings.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of light emitting panels are provided. The structure of the light emitting panel may include at least two major levels. One level is configured as a light emitting level including an array of light emitting devices and provides luminescence for the panel. The light emitting devices can be made with organic or inorganic material. Another level is a circuit level which is electrically coupled to the light emitting level and vertically stacking with the light emitting level. The circuit level supplies power and control signals to the light emitting level in order to display the color or pattern as needed. In some embodiments, the arrangement of the light emitting devices in the array is determined through a photolithography operation.

Figure 1:
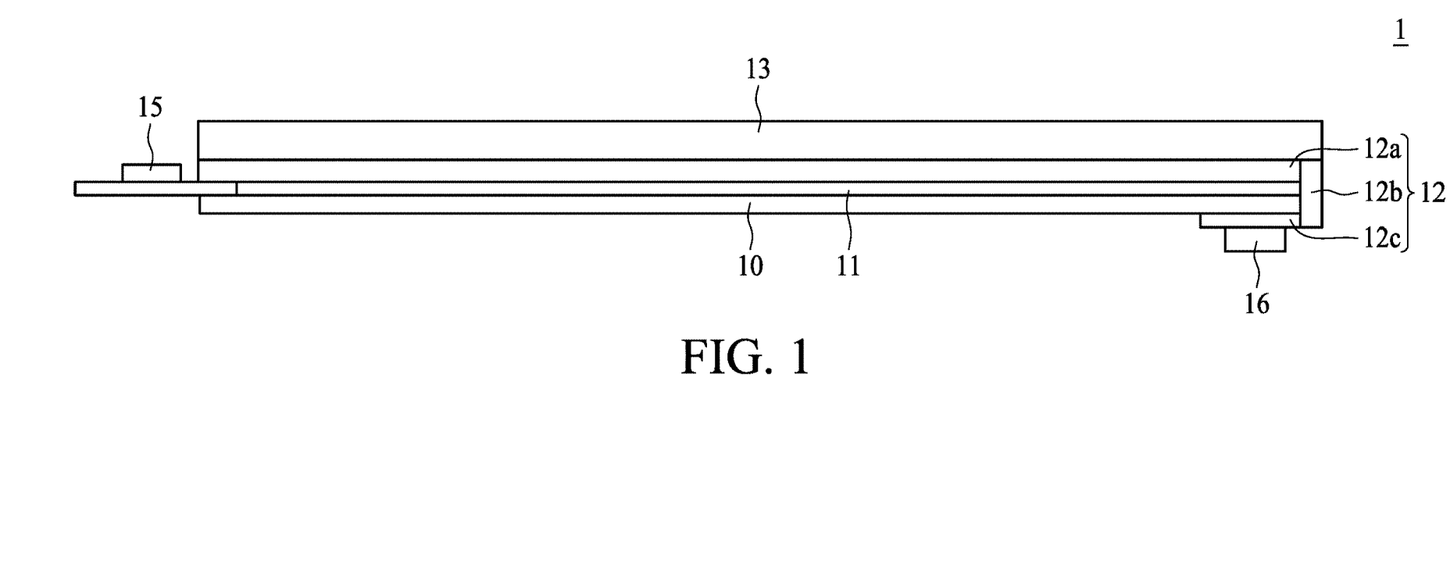
FIG. 1 illustrates a cross-sectional view of a display device in accordance with some embodiments of the present disclosure.

FIG. 1 illustrates a cross-sectional view of a display device 1 (or a display panel) in accordance with some embodiments of the present disclosure. The display device 1 includes a photo sensing layer 10, an optical component 11, a light emitting device 12, a cover 13 and electronic components 15 and 16. In some embodiments, the display device 1 can be used or implemented in electronic devices such as television screens, computer monitors, portable systems such as smariphones, handheld game consoles and PDAs. The display device 1 can be a rigid or a flexible display.

The photo sensing layer 10 may include a plurality of photo sensing units (or photo sensors). For example, the photo sensing layer 10 includes an array of the photo sensing units. For example, the photo sensing layer 10 includes M×N photo sensing units, where M and N are integers greater than 1. The photo sensing layer 10 is configured to output electrical signals in accordance with optical signals of the light received by the photo sensing layer 10. For example, the photo sensing layer 10 is configured to receive the light and convert intensity of the light into electrical signals. In some embodiments, each photo sensing unit of the photo sensing layer 10 may include one or more of photo resistors (i.e., elements having varying resistance values in accordance with incident light), photo transistors, (i.e., elements amplifying current values between bases/gates and collectors/emitters in accordance with incident light), and/or photo diodes.

The optical component 11 is disposed on the photo sensing layer 10 to cover the photo sensing layer 10. The optical component 11 is configured to adjust or change the characters (e.g., incident angle, frequency, intensity or the like) of the light passing through the optical component 11. In some embodiments, the optical component 11 may be or include a microlens array (MLA), a collimator, a diffuser or a combination thereof.

The light emitting device 12 is disposed on the optical component 11. In some embodiments, the light emitting device 12 may include portions 12a, 12b and 12c. In some embodiments, the portions 12a, 12b and 12c are integratedly formed. Alternatively, the portions 12a, 12b and 12c are individual parts and connected. The portion 12a is disposed on a top surface of the optical component 11. The portion 12h is disposed on lateral surfaces of the optical component 11 and the photo sensing layer 10. The portion 12c is disposed on a bottom surface of the photo sensing layer 10. In other embodiments, the light emitting device 12 can be disposed on only the top surface of the optical component 11.

Figure 2:
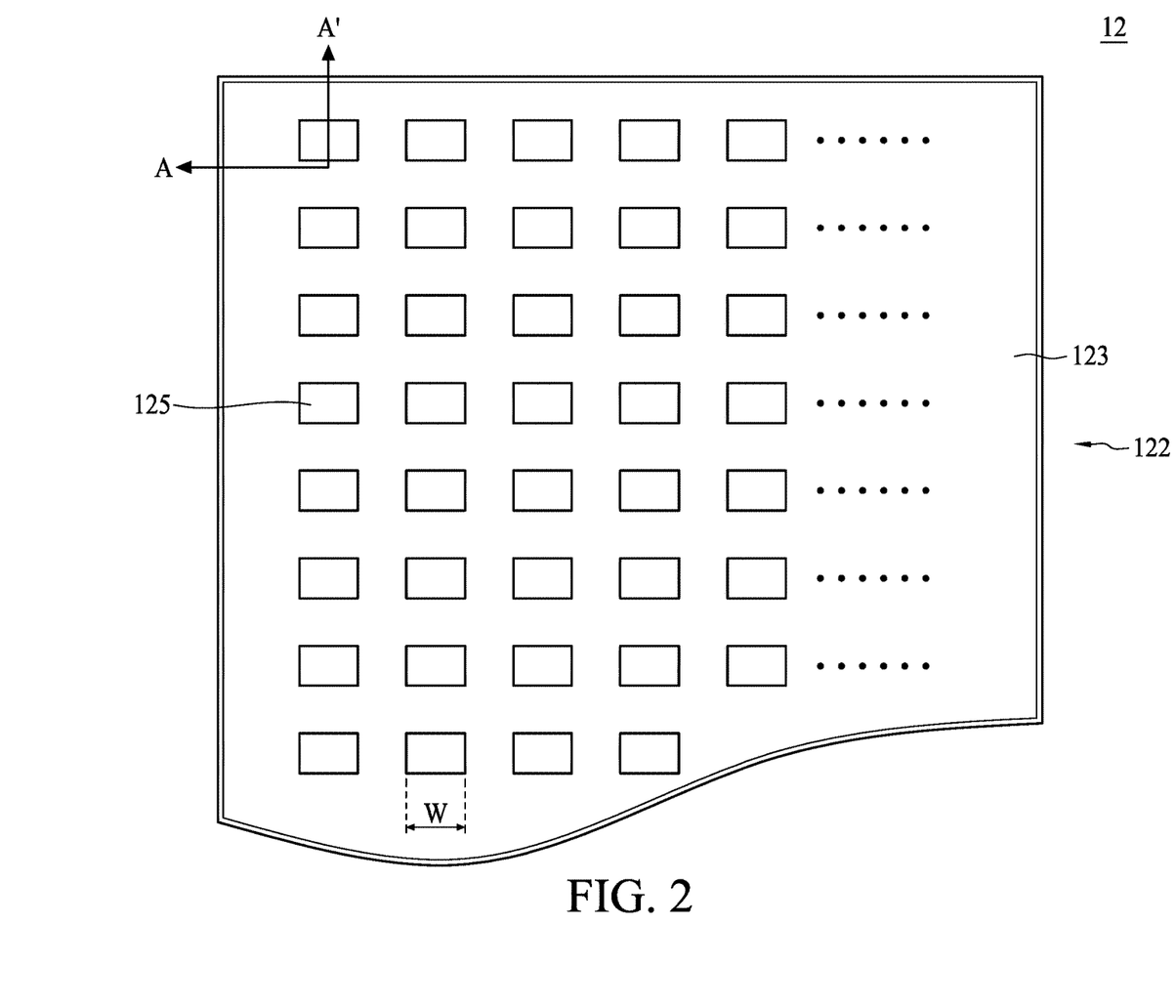
FIG. 2 illustrates a top view of a light emitting device in accordance with some embodiments of the present disclosure.

In some embodiments, the light emitting device 12 may include a plurality of light emitting units (e.g., OLED or AMOLED). For example, as shown in FIG. 2, which illustrates a top view of a portion of the light emitting device 12, in accordance with some embodiments of the present disclosure, the light emitting device 12 may include many light emitting units 125 (also can be referred as light emitting pixels or pixels). In some embodiments, the light emitting units 125 can be arranged in an array. For example, the light emitting device 12 may include M×N light emitting units 125, where M and N are integers greater than 1. In some embodiments, as shown in FIG. 2, the light emitting device 12 may include a substrate 122 and a light emitting layer 123 disposed thereon. In some embodiments, several conductive traces may be disposed in the substrate 122 and form circuitry to provide current to the light emitting layer 123. In some embodiments, the substrate 122 may include a TFT (thin film transistor) array.

In some embodiments, the light emitting units 125 are configured as mesa disposed on the substrate 122. In some embodiments, the light emitting units 125 are configured to be in recesses of the substrate 122. In some embodiments, the light emitting units 125 can be arranged in an array. Each independent light emitting unit is separated from other adjacent light emitting units. In some embodiments, the separation distance between two adjacent light emitting units is between about 2 run and about 100 um. In some embodiments, the separation distance is controlled to be at least not greater than about 50 um so that the density of the light emitting units 125 can be designed to be at least more than 700 ppi or 1200 ppi. In some embodiments, a light emitting unit 125 has a width W, being between about 2 nm and about 500 um. In some embodiments the width W is not greater than about 2 um.

Figure 3:
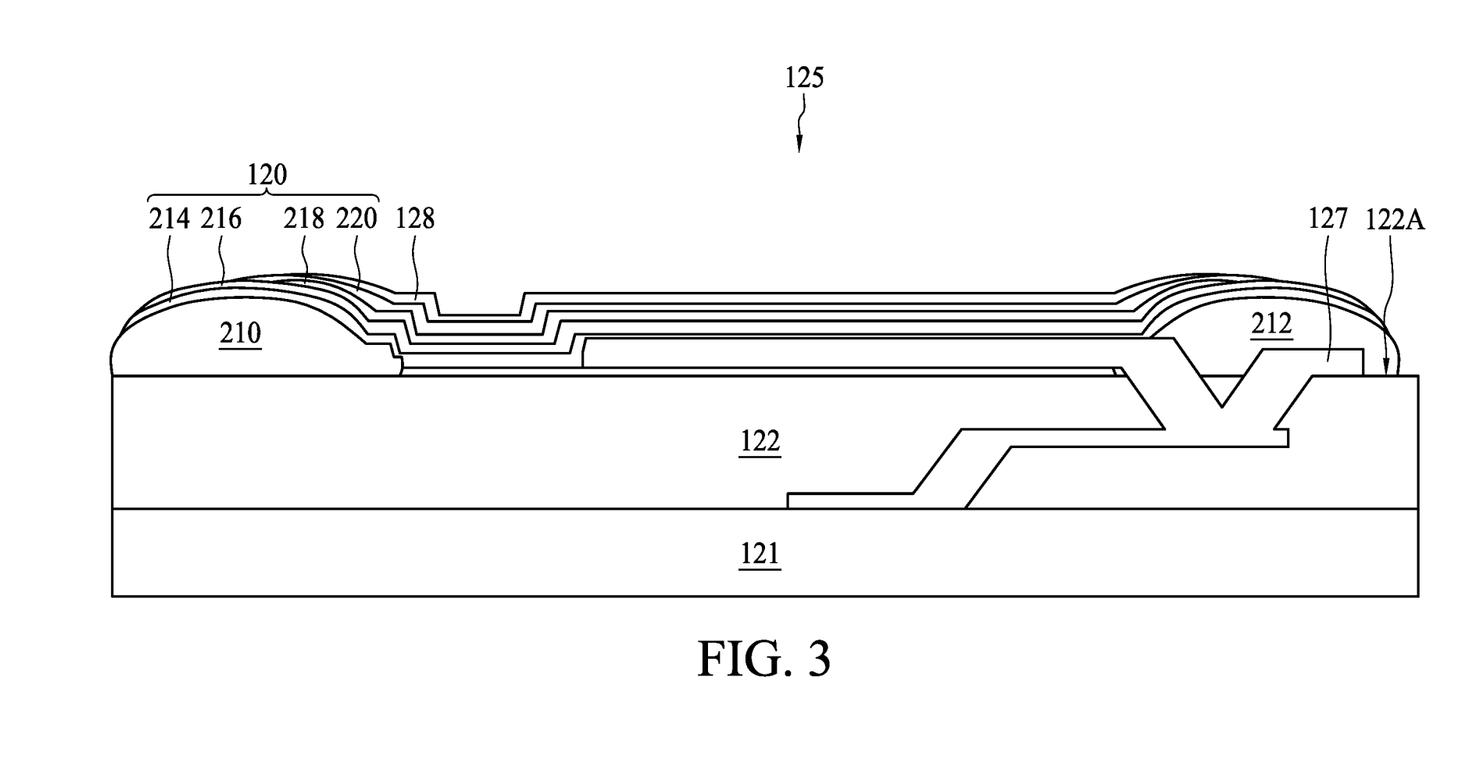
FIG. 3 illustrates a cross-sectional view of a light emitting accordance with some embodiments of the present disclosure.

FIG. 3 illustrates a cross-sectional view of a pixel (i.e., a light emitting unit 125) of the light emitting device 12 taken along A-A' as shown in FIG. 2, in accordance with some embodiments of the present disclosure. As shown in FIG. 2B, the light emitting unit 125 may include a TFT layer 121, the substrate 122 over the TFT layer 121, and the light emitting layer (including electrodes 127, 128 and an organic layer 120) over the substrate 122. In some embodiments, the light emitting device 12 may include several bumps 210 and 212 over the substrate 122. In some embodiments, each independent light emitting unit 125 is separated from other adjacent light emitting units 125 by the bumps 210 and 212. The bumps 210 and 212 are also called pixel defined layer (PDL). The bumps 210 and 212 can be formed in different types of shape. In some embodiments, the bumps have a curved surface. In some embodiments, the shape of the bumps is trapezoid.

In some embodiments, the electrode 127 is disposed on the substrate 122 and may extend within the substrate 122. The electrode 128 is disposed over the electrode 127. The organic layer 120 is disposed between the electrode 127 and the electrode 128. In some embodiments, the electrodes 127, 128, and the organic layer 120 are stacked on the substrate 122 along the direction perpendicular to a top surface 122A of the substrate 122. In some embodiments, the electrode 127 is partially covered by the bumps 210 and 212. In some embodiments, the bumps 210 and 212 are partially covered by the organic layer 120 and the electrode 128. In some embodiments, the electrodes 127 and 128 are respectively employed as the anode and the cathode of the light emitting device 12.

In some embodiments, the organic layer 120 may include a first type carrier injection layer 214, a first type carrier transportation layer 216, an organic emissive layer (EM) layer 218, and a second type carrier transportation layer 220.

In some embodiments, the first type carrier injection layer 214 is an electron injection layer (EIL) and the first type carrier transportation layer 216 is an electron transportation layer (ETL). In some embodiments, the first type carrier injection layer 214 is a hole injection layer (HIL) and the first type carrier transportation layer 216 is a hole transportation layer (HTL). In some embodiments, the second type carrier transportation layer 220 can be a hole or electron transportation layer 220. In some embodiments, the second type carrier transportation layer 220 and the first type carrier transportation layer 216 is respectively configured for opposite types of charges. In some embodiments, a second type carrier injection layer (not shown in the figures) is further disposed over the second type carrier transportation layer 220. In some embodiments, the EM layer 218 is configured to emit a light of a range of wavelength.

Under certain voltage driving, the electron and the hole are respectively injected into the electron and hole transporting layers 216 and 220 from the cathode and the anode. The electron and the hole respectively migrate from the electron and hole transporting layers 216 and 220 to the EM layer 218 and bump into each other in the EM layer 218 to form an exciton to excite the emitting molecule.

Due to the intrinsic characteristics of the organic layer 120, the light emitting device 12 may include the issues of burn-in, mura, IR-drop and/or degradation, which would adversely affect the performance of the display device 1. In some embodiments, the burn-in issue may be compensated by changing the luminance of different areas of a display. In some embodiments, the mura and IR drop issues can be compensated by compensation circuits in the light emitting device 12. For example, the mura issue can be mitigated by a Vth compensation circuit, and the IR drop issue can be mitigated by a VDD compensation circuit. However, such compensation circuits are connected to each pixels (e.g., the light emitting units) of the OLED panel (e.g., the light emitting device 12). As the number of the pixels of the OLED panel increases, the number or the complexity of the compensation circuits should increase as well. This will increase the area and the power consumption of the OLED panel. In addition, it is difficult to solve the issues of burn-in, mura, IR drop and degradation simultaneously. In accordance with some embodiments of the present disclosure, the issues of burn-in, mura, IR drop and degradation can be solved simultaneously by using the electronic components 15 and 16 of the display device 1 as shown in FIG. 1.

Referring to FIG. 1, the electronic component 16 (a die or a chip) is electrically connected to the light emitting device 12. In some embodiments, the electronic component 16 may be or include a display driver integrated circuit (DDIC). In some embodiments, the electronic component 16 is connected to the driving circuits (e.g., the TFT layer 121) of each of the light emitting units 125 of the light emitting device 12. The electronic component 16 is configured to generate signal (e.g., clock, control signal and the like) to control the light emitting device 12 to emit light of different colors to achieve the function of displaying images. For example, the electronic component 16 is configured to control the driving circuits to send a driving current (or voltage) to each of the light emitting units 125 of the light emitting device 12, and the light emitting units 125 are driven by the driving current to emit light with a luminance that corresponds to a magnitude of the driving current. Various kinds of circuits can serve as the driving circuit for driving the light emitting units 125. For example, the driving circuit may include a plurality of transistors and at least one storage capacitor. For example, the driving circuit can include a drive configuration indicated as a 5T/1C type, a 4T/1C type, a 3T/1.0 type, a 2'F/1C type or the like, where T represents a transistor and C represents a storage capacitor.

The electronic component 15 (a die or a chip) is electrically connected to the electronic component 16. In some embodiments, the electronic component 15 may be or include an identification integrated circuit (IDIC). The electronic component 15 is configured to store the information corresponding each of the light emitting units 125 of the light emitting device 12. For example, the electronic component 15 may include a memory to store the address and/or the data corresponding to the default values of the parameters (e.g., intensity, color and the like) of each of the light emitting units 125 of the light emitting device 12. In other embodiments, the memory may be excluded from the electronic component 15 and electrically connected to the electronic component 15. The electronic component 15 is connected to the photo sensing layer 10 to receive the signal corresponding to the parameters of the light detected by the photo sensing layer 10. The light detected by the photo sensing layer 10 may be emitted from the light emitting device 12 or any other external lighting sources.

In some embodiments, the electronic component 15 is configured to compare the signal received from the photo sensing layer 10 with the data corresponding to the information (e.g., intensity or color) of the light emitting units 125 stored in the memory. In the case that the parameters of some of the light emitting units 125 are different from the default (or predetermined) values of those light emitting units 125 stored in the memory, the electronic component 15 is configured to determine those light emitting units 125 as abnormal light emitting units 125 and to indicate the addresses of those abnormal light emitting units 125.

In some embodiments, the electronic component 15 is configured to generate signals (e.g., compensation signals or calibration signal) if any abnormal light emitting unit 125 is found, and to send the compensation signals to the electronic component 16. After the electronic component 16 receives the compensation signals from the electronic component 15, the electronic component 16 is configured to control the driving circuits to adjust the parameters (e.g., intensity and/or the color) of the abnormal light emitting units 125. For example, the electronic component 16 is configured to adjust the gamma voltage so as to guarantee a consistency of the gamma curve of the abnormal light emitting units 125 with a standard gamma curve. In some embodiments, the adjustment may be achieved by changing the current or voltage applied to the abnormal light emitting units 125. In other embodiments, the compensation signals can be generated by the electronic component 16 after any abnormal light emitting unit 125 is found by the electronic component 15. In some embodiments, the electronic components 15 and 16 can be integrated into a single electronic component (e.g., a chip or a die).

In some embodiments, the electronic component 15 may include a fingerprint identification/recognition circuit. The electronic component 15 is configured to compare the fingerprint information detected by the photo sensing layer 10 with the fingerprint information stored in the memory, and to determine whether the detected fingerprint is authorized.

The cover 13 is disposed on the light emitting device 12. In some embodiments, the cover 13 is formed of or includes light transparent materials (e.g., glass) to allow the light generated by the light emitting device 12 passing through.

Figure 4:
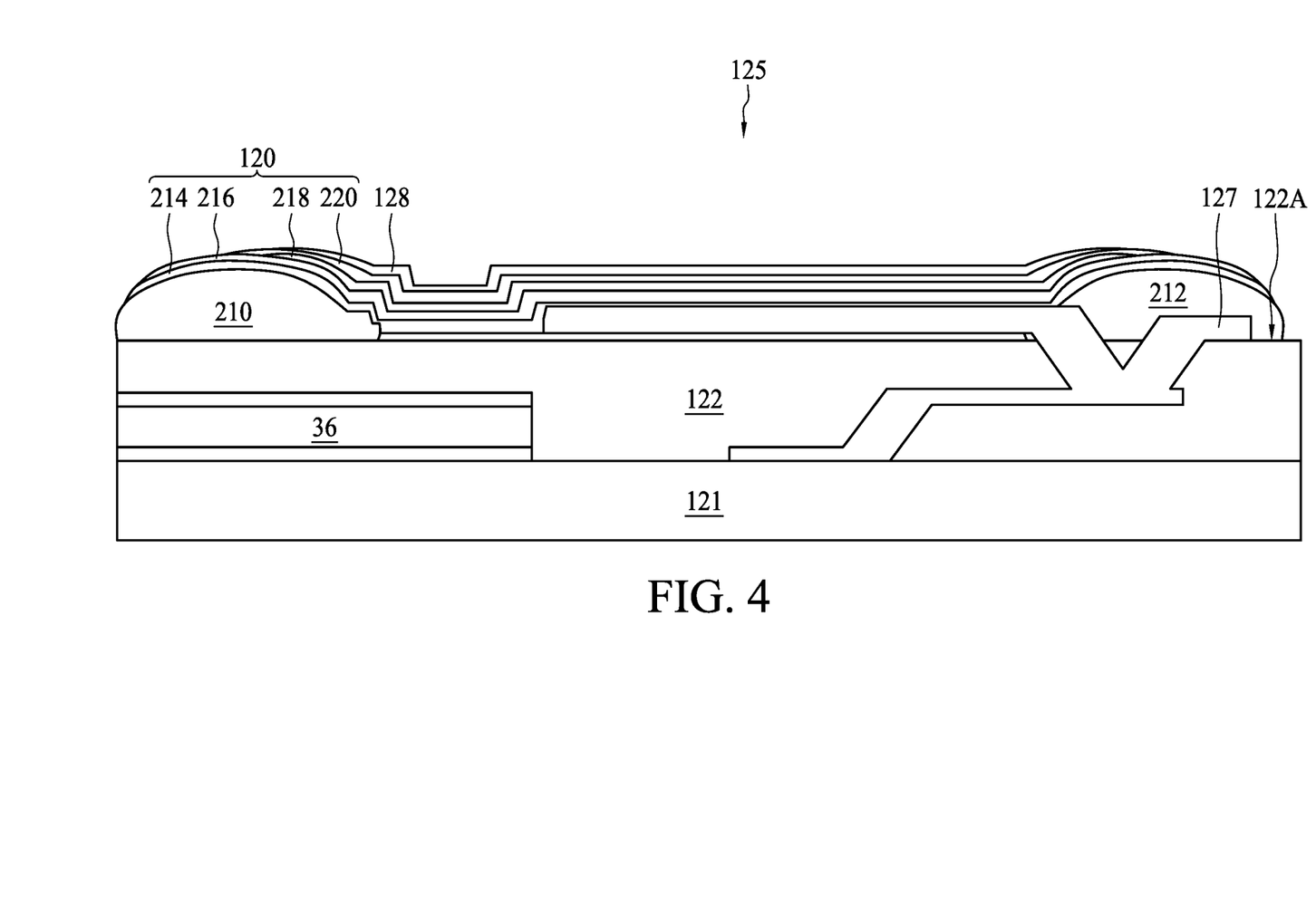
FIG. 4 illustrates a cross-sectional view of a light emitting unit in accordance with some embodiments of the present disclosure.

FIG. 4 illustrates a cross-sectional view of a pixel (i.e., a light emitting unit 125') of a light emitting device in accordance with some embodiments of the present disclosure. The light emitting unit 125' is similar to the light emitting unit 125 in FIG. 3 except that the light emitting unit 125' further includes a light sensing region 36.

The light sensing region 36 is disposed within the substrate 122. In some embodiments, the light emitting unit 125' may include several light sensing regions 36 in the substrate 122. The light sensing region 36 is configured to receive the light and to output electrical or optical signals in accordance with the received light. In some embodiments, the light sensing region may include one or more of photo resistors (i.e., elements having varying resistance values in accordance with incident light), photo transistors, (i.e., elements amplifying current values between bases/gates and collectors/emitters in accordance with incident light), and/or photo diodes.

In some embodiments, the light emitting units 125 of the light emitting device 12 in FIG. 3 can be replaced by the light emitting units 125' in FIG. 4. In such embodiments, the photo sensing layer 10 of the display device 1 in FIG. 1 can be omitted. This would reduce the thickness of the display device 1. In other embodiments, the light emitting units 125 of the light emitting device 12 in FIG. 3 can be replaced by any other light emitting units.

Under certain voltage driving, the emitting layer 218 forms excitons to excite the emission lights. A part of the emission lights is received by the light sensing region 36. The emission light is converted into data information by the light sensing region 36. In some embodiments, the emission light absorbed in the light sensing region 36 converts to charge carriers. In some embodiments, the charge carrier can be positive or negative. The charge carriers flow to a contact plug so as to transfer information about the characteristic of the emission light to the circuitry in the TFT layer 121 for further processing and/or output.

In some embodiments, the light sensing region 36 is coupled to another semiconductor device, such as a transistor, through the contact plug. Data information is transferred from the transistor to the circuitry in the TFT layer 121.

In some embodiments, the characteristic of the emission light is compared to a standard value (a predetermined value or a default value) by a functional module in the TFT layer 121. In some embodiments, the paragraphs (e.g., intensity, brightness, color or the like) of the emission light is compared. In some embodiments, since the mission light is sensed by the light sensing region 36 during an operating time of the light emitting device 12, the characteristic of the emission light may be detected immediately and accurately. In some embodiments, if the characteristic is deviated from the standard value, compensation to the voltage may be made in time. For examples, if the brightness of the emission light is detected to be lower than the standard value, the TFT layer 121 may functioned to increase the voltage of the pixel emitting the emission light.

Figure 5:
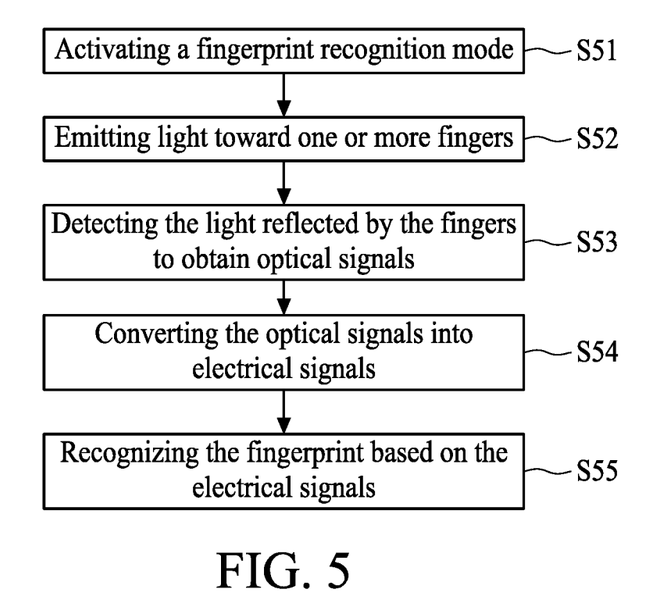
FIG. 5 illustrates a flow chart showing operations for performing fingerprint recognition in accordance with some embodiments of the present disclosure.

FIG. 5 illustrates a flow chart showing operations for performing fingerprint recognition, in accordance with some embodiments of the present disclosure. In some embodiments, the operations shown in FIG. 5 can be implemented by the display device 1 as shown in FIG. 1. Alternatively, the operations shown in FIG. 5 can be implemented by any other display devices or electronic devices.

Referring to operation S51, a fingerprint recognition mode is activated. In some embodiments, the fingerprint recognition mode can be activated by a command received from a system including the display device 1. For example, the fingerprint recognition mode can be activated by a user to operate some software (or application) in the system or to input some commands. In some embodiments, when the fingerprint recognition mode has been activated, a calibration mode would be turned off.

Referring to operation S52, the light is emitted toward one or more fingers. In some embodiments, the electronic component 16 is configured to control the light emitting device 12 to emit the light toward the finger(s) placed on the cover 13.

Referring to operation S53, the light reflected by the finger(s) is detected or received to obtain optical signals. In some embodiments, the reflected light is received by the photo sensing layer 10 to obtain the optical signals (e.g., intensity, color or the like).

Referring to operation S54, the optical signals are converted to electrical signals. In some embodiments, the photo sensing layer 10 is configured to output electrical signals in accordance with the light received by the photo sensing layer 10. For example, the photo sensing layer 10 is configured to receive the light and convert intensity of the light into electrical signals. For example, the electrical signals correspond to the parameters of the light received by the photo sensing layer 10. In some embodiments, the photo sensing layer 10 is also configured to detect the location of the finger(s) on the cover 13 based on the optical signals corresponding to the reflected light. In some embodiments, the photo sensing layer 10 is configured to transmit the electrical signals to the electronic component 15.

Referring to operation S55, the fingerprint is recognized based on the electrical signals. In some embodiments, the electronic component 15 is configured to compare the electrical signals corresponding to the fingerprint information detected by the photo sensing layer 10 with the data corresponding to the fingerprint information stored in the memory, and to determine whether the detected fingerprint is authorized.

Figure 6:
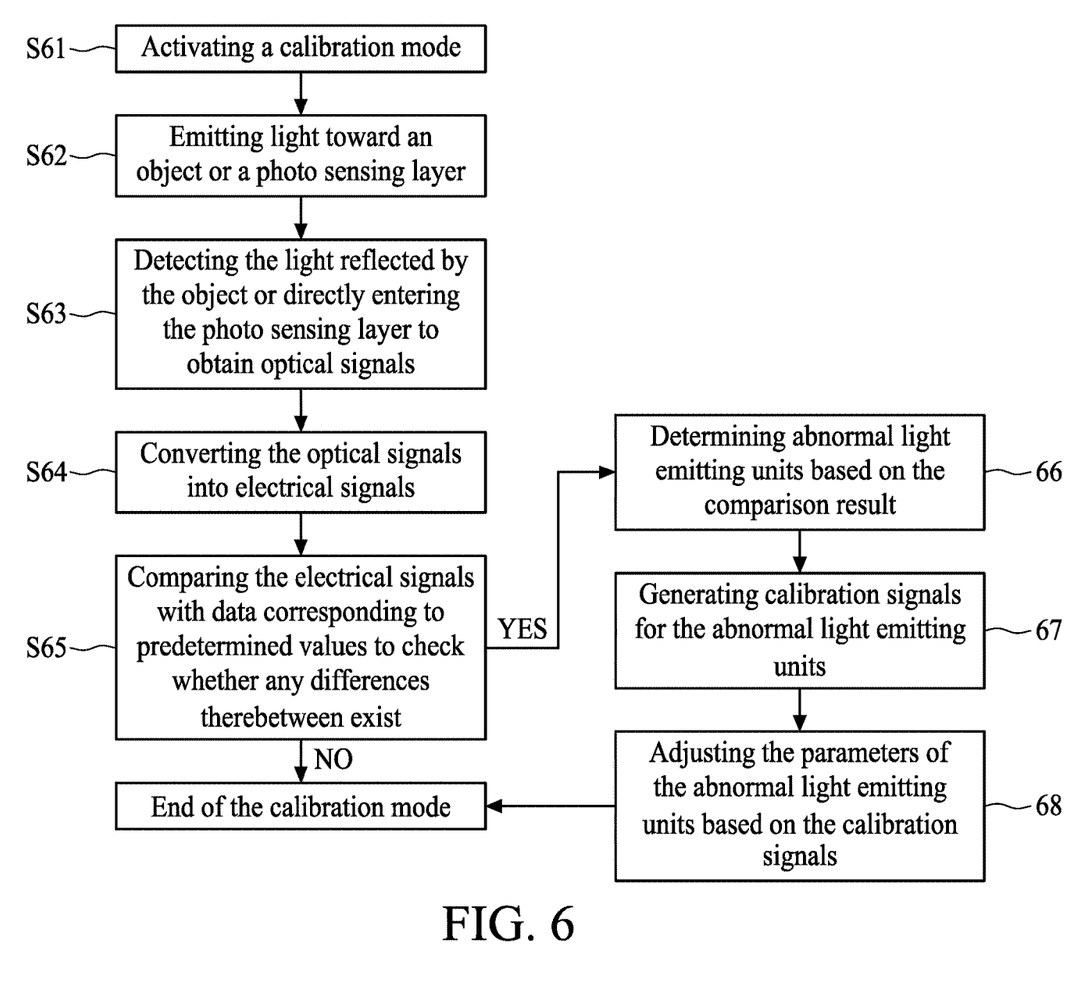
FIG. 6 illustrates a flow chart showing operations for performing a calibration in accordance with some embodiments of the present disclosure.

FIG. 6 illustrates a flow chart showing operations for performing a calibration (or compensation) for light emitting units, in accordance with some embodiments of the present disclosure. In some embodiments, the operations shown in FIG. 6 can be implemented by the display device 1 as shown in FIG. 1. Alternatively, the operations shown in FIG. 6 can be implemented by any other display devices or electronic devices.

Referring to operation S61, a calibration mode is activated. In some embodiments, the calibration mode can be activated by a command received from a system including the display device 1. For example, the compensation mode can be activated by a user to operate some software (or application) in the system or to input some commands (e.g., reboot the system or entering an engineering mode). In some embodiments, when the calibration mode has been activated, the fingerprint recognition mode would be turned off. In some embodiments, the calibration mode is activated for cancelling or mitigating the abnormal light emitting units 125 or 125' (which may include the issues of burn-in, mura, IR-drop, degradation and the like) of the display device 1.

Referring to operation S62, the light emitting device 12 is controlled to emit light. In some embodiments, the electronic component 16 is configured to control the light emitting device 12 to emit the light. In some embodiments, the light emitted from the light emitting device 12 may be black and white (or grayscale) light. In some embodiments, the light emitted from the light emitting device 12 may be or include $2^N$-bit grayscale, where N is an integer greater than 1.

In some embodiments, the light emitted from the light emitting device 12 is emitted toward an object (e.g., a reflection board, a mirror or the like) disposed on the cover 13 to fully cover the light emitting device 12 to reflect the light. In some embodiments, the light emitted from the light emitting device 12 is directly toward the photo sensing layer 10 of the display device 1 or the light sensing region 36 of the light emitting units 125'.

Referring to operation S63, the light emitted by the light emitting device 12 or the light reflected by the object is received or detected to obtain optical signals. In some embodiments, the photo sensing layer 10 (or the light sensing region 36) is configured to receive the light reflected from the object or the light directly emitted from the light emitting device 12 toward the photo sensing layer 10 (or the light sensing region 36). In some embodiments, the photo sensing layer 10 (or the light sensing region 36) is configured to obtain the optical signals corresponding to the information of each of the light emitting units 125 (or the light emitting units 125') of the light emitting device 12 based on the received light.

Referring to operation S64, the optical signals are converted into electrical signals. In some embodiments, the photo sensing layer 10 (or the light sensing region 36) is configured to output electrical signals in accordance with the light received by the photo sensing layer 10 (or the light sensing region 36). For example, the photo sensing layer 10 (or the light sensing region 36) is configured to receive the light and convert intensity of the light into electrical signals. For example, the electrical signals correspond to the parameters of the light received by the photo sensing layer 10 (or the light sensing region 36). In some embodiments, the photo sensing layer 10 (or the light sensing region 36) is configured to transmit the electrical signals to the electronic component 15.

Referring to operation S65, the electrical signals corresponding to the information or parameters (e.g., intensity, color or the like) of each of the light emitting units 125 (or the light emitting units 125') of the light emitting device 12 are compared with the data corresponding to the predetermined (default or standard) information of each of the light emitting units 125 (or the light emitting units 125') of the light emitting device 12 to check whether any differences therebetween exist.

In the case that the parameters of some of the light emitting units 125 (or the light emitting units 125') are different from the default values stored in the memory, those light emitting units 125 (or the light emitting units 125') are determined as abnormal light emitting units 125 (or abnormal light emitting units 125') as shown in operation 566. In addition, the addresses of those abnormal light emitting units 125 (or abnormal light emitting units 125') are also indicated. In the case that none of the light emitting units 125 (or light emitting units 125') is determined as being abnormal, the calibration mode is completed. In some embodiments, the comparison operation is achieved by the electronic component 15.

Referring to operation S67, a compensation or calibration signal is generated if any abnormal light emitting unit 125 (or abnormal light emitting units 125') is found. In some embodiments, the calibration signal can be generated by the electronic component 15 and then transmitted to the electronic component 16. Alternatively, the calibration signal can be generated by the electronic component 16.

Referring to operation 68, the parameters (e.g., intensity and/or the color) of the abnormal light emitting units 125 (or the abnormal light emitting units 125') are adjusted based on the calibration signal. In some embodiments, the electronic component 16 is configured to control the driving circuits to adjust the parameters of the abnormal light emitting units 125 (or the abnormal light emitting units 125') by changing the currents or voltages applied to the abnormal light emitting units 125 (or the abnormal light emitting units 125'). For example, the electronic component 16 is configured to adjust the gamma voltage so as to guarantee a consistency of the gamma curve of the abnormal light emitting units 125 with the standard gamma curve. For example, if the intensity of a light emitting unit (which would be determined as being abnormal) is greater than a predetermined value of the intensity of the light emitting unit, the electronic component 16 is configured to control the driving circuit of the light emitting unit to reduce the voltage or current applied to the light emitting unit, and vice versa.

In accordance with the embodiments as shown in FIGS. 1-6 of the present disclosure, the issues of burn-in, mura, IR-drop and degradation can be calibrated, eliminated or mitigated simultaneously. In addition, the calibration operation for abnormal pixels can be performed by merely using the components (e.g., the photo sensing layer 10, the light emitting device 12, the electronic components 15 and 16) within the display device 1, and hence the calibration operation can be performed by an end-user, which would simplify the calibration operation for the display device 1.

As used herein, the terms "substantially," "substantial," "approximately," and "about" are used to denote and account for small variations. For example, when used in conjunction with a numerical value, the terms can refer to a range of variation of less than or equal to +10% of that numerical value, such as less than or equal to +5%, less than or equal to ±4%, less than or equal to +3%, less than or equal to +2%, less than or equal to +1%, less than or equal to ±0.5%, less than or equal to +0.1%, or less than or equal to +0.05%. As another example, a thickness of a film or a layer being "substantially uniform" can refer to a standard deviation of less than or equal to +10% of an average thickness of the film or the layer, such as less than or equal to +5%, less than or equal to +4%, less than or equal to +3%, less than or equal to ±2%, less than or equal to ±1%, less than or equal to +0.5%, less than or equal to +0.1%, or less than or equal to +0.05%. The term "substantially coplanar" can refer to two surfaces within 50 µm of lying along a same plane, such as within 40 µm, within 30 µm, within 20 µm, within 10 µm, or within 1 µm of lying along the same plane. Two components can be deemed to be "substantially aligned" if, for example, the two components overlap or are within 200 µm, within 150 µm, within 100 µm, within 50 µm, within 40 µm, within 30 µm, within 20 µm, within 10 µm, or within 1 µm of overlapping. Two surfaces or components can be deemed to be "substantially perpendicular" if an angle therebetween is, for example, 90°±10°, such as ±5°, ±4°, ±3°, ±2°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A display device, comprising:
   a light emitting device configured to emit light, the light emitting device having a plurality of light emitting units;
   a photo sensing layer configured to receive the light and to generate a first signal according to the received light, the first signal corresponding to a parameter of the light emitting units;
   a first electronic component configured to control the light emitting units; and
   a second electronic component configured to compare the first signal with data corresponding to a predetermined parameter of the light emitting units and to identify which light emitting unit has a different parameter with respect to the predetermined parameter.

2. The display device of claim 1, wherein the second electronic component is configured to determine the light emitting unit having the different parameter with respect to the predetermined parameter as an abnormal light emitting unit.

3. The display device of claim 2, wherein the second electronic component is configured to identify an address of the abnormal light emitting unit.

4. The display device of claim 2, wherein the second electronic component is configured to generate a calibration signal for the abnormal light emitting unit and to transmit the calibration signal to the first electronic component.

5. The display device of claim 4, wherein the first electronic component is configured to adjust the parameter of the abnormal light emitting unit based on the calibration signal.

6. The display device of claim 5, wherein the first electronic component is configured to adjust a current or voltage applied to the abnormal light emitting unit.

7. The display device of claim 2, wherein the first electronic component is configured to generate a calibration signal for the abnormal light emitting unit.

8. The display device of claim 7, wherein the first electronic component is configured to adjust the parameter of the abnormal light emitting unit based on the calibration signal.

9. The display device of claim 8, wherein the first electronic component is configured to adjust a current or voltage applied to the abnormal light emitting unit.

10. The display device of claim 2, wherein the second electronic component is configured to adjust a gamma voltage of the abnormal light emitting unit to guarantee a consistency of the gamma curve of the abnormal light emitting unit with a standard gamma curve.

11. The display device of claim 1, wherein the light emitting device and the photo sensing layer are spaced apart from each other.

12. The display device of claim 11, further comprising a microlens array (MLA), a collimator and/or a diffuser disposed between the light emitting device and the photo sensing layer.

13. The display device of claim 1, wherein the photo sensing layer is integrated within each of the light emitting units of the light emitting device.

14. The display device of claim 1, wherein the first electronic component and the second electronic component are integrated within a chip or a die.

15. The display device of claim 1, wherein the parameter includes intensity or color.

16. The display device of claim 1, wherein the light from the light emitting device is emitted toward the photo sensing layer.

17. The display device of claim 1, wherein the light from the light emitting device is emitted toward an object covering the light emitting device and reflected to the photo sensing layer.

* * * * *